United States Patent [19]

Rosen et al.

[11] Patent Number: 5,051,789

[45] Date of Patent: Sep. 24, 1991

[54] DEVICE HAVING TWO OPTICAL PORTS FOR SWITCHING APPLICATIONS

[75] Inventors: Ayre Rosen, Cherry Hill, N.J.; Paul J. Stabile, Langehorne, Pa.

[73] Assignee: The United States of America as represented by the United States Department of Energy, Washington, D.C.

[21] Appl. No.: 595,528

[22] Filed: Oct. 11, 1990

[51] Int. Cl.[5] .......................................... H01L 31/12
[52] U.S. Cl. ..................................... 357/19; 357/17; 357/30; 357/58; 250/551
[58] Field of Search ..................... 357/19, 30 P, 30 G, 357/17, 58, 30 D, 74, 45, 68, 32; 250/551

[56] References Cited

U.S. PATENT DOCUMENTS

| | | | |
|---|---|---|---|
| 3,452,206 | 6/1969 | Biet et al. | 357/30 P X |
| 3,917,943 | 11/1975 | Austen | 250/211 J |
| 4,088,837 | 5/1978 | Lewis | 350/96.15 |
| 4,127,784 | 11/1978 | Proud et al. | 307/311 |
| 4,192,574 | 3/1980 | Henry et al. | 350/96.17 |
| 4,240,088 | 12/1980 | Myers | 357/19 |
| 4,326,771 | 4/1982 | Henry et al. | 350/96.17 |
| 4,376,285 | 3/1983 | Leonberger et al. | 357/17 |
| 4,399,453 | 8/1983 | Berg et al. | 357/81 |
| 4,673,864 | 6/1987 | Dessens et al. | 323/221 |
| 4,675,624 | 6/1987 | Rosen et al. | 333/161 |
| 4,805,084 | 2/1989 | Rosen et al. | 363/147 |
| 4,825,081 | 4/1989 | Wille et al. | 250/551 |
| 4,899,204 | 2/1990 | Rosen et al. | 357/30 D |

FOREIGN PATENT DOCUMENTS 61-4274  1/1986  Japan ................................ 357/30 P

OTHER PUBLICATIONS

Rosen et al., "Switching Technology from DC to GHz Using 2-Semiconductor Laser Arrays," SPIE, Los Angeles, Jan. 14–19, 1990, pp. 1–7.
Rosen et al., "100 kW DC-Biased, All Semiconductor Switch Using Si P-I-N Diodes and AlGaAs 2-D Laser Arrays," IEEE Photonics Technology Letters, vol. 1, No. 6, Jun. 1989, 132–4.
Rosen et al., "Laser Activated PIN Diode Switch from DC to mm-Wave," Electronic Shown and Convention, Apr. 11–13, 1989, New York, New York, pp. 13/4, 1–6.
Rosen et al., "Optically Achieved P-I-N Diode Switch Utilizing a Two-Dimensional Laser Array at 808 nm as an Optical Source," IEEE Transactions on Electron Devices, vol. 36, No. 2, Feb. 1989, pp. 367–374.
Müller, "Thin Silicon Film P-I-N Photodiodes with Internal Reflection," IEEE Transactions on Electron Devices, vol. ED-25, No. 2, Feb. 1978, pp. 247–253.

Primary Examiner—William Mintel
Attorney, Agent, or Firm—L. E. Carnahan; Roger S. Gaither; William R. Moser

[57] ABSTRACT

A two-sided light-activatable semiconductor switch device having an optical port on each side thereof. The semiconductor device may be a p-i-n diode or of bulk intrinsic material. A two ported p-i-n diode, reverse-biased to "off" by a 1.3 kV dc power supply, conducted 192 A when activated by two 1 kW laser diode arrays, one for each optical port.

19 Claims, 1 Drawing Sheet

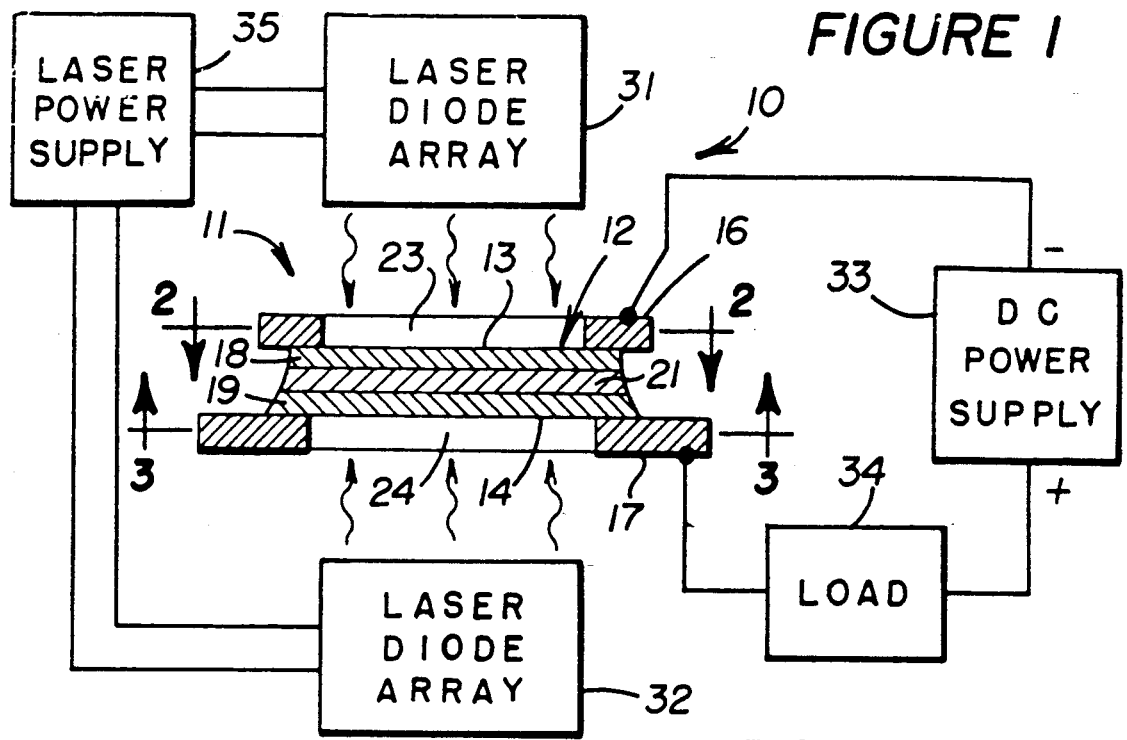
FIGURE 1
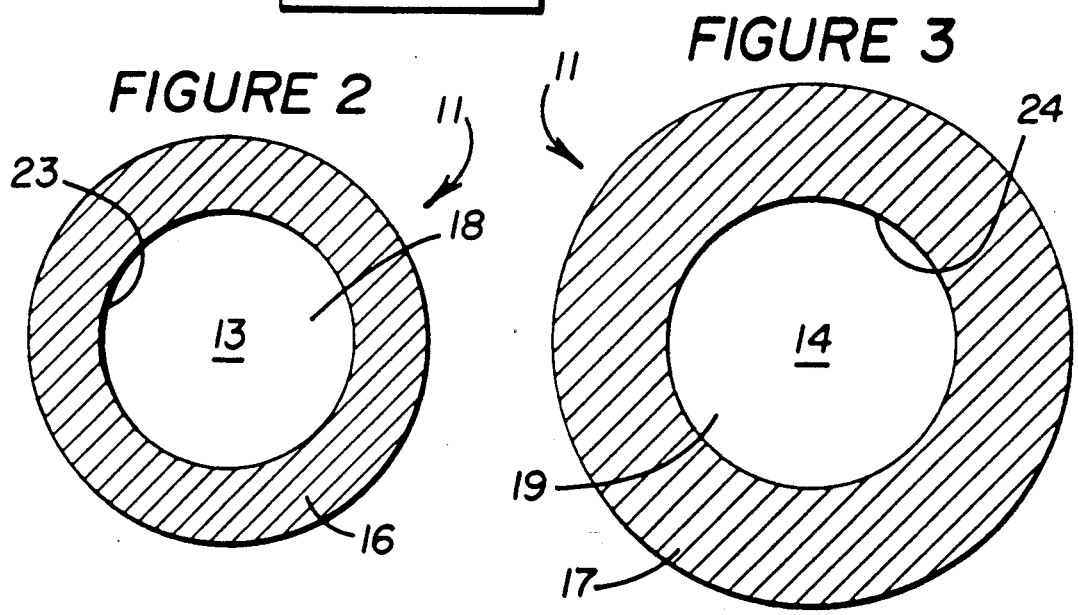
FIGURE 2
FIGURE 3
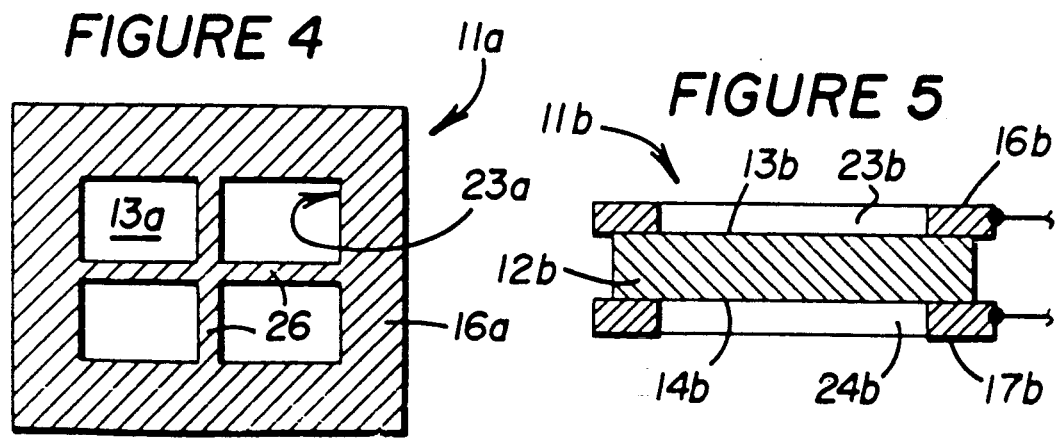
FIGURE 4
FIGURE 5

DEVICE HAVING TWO OPTICAL PORTS FOR SWITCHING APPLICATIONS

The Government has rights in this invention pursuant to Contract No. DE-AC03-87SF17127 awarded by the U.S. Department of Energy.

This invention relates to optically-controlled high-power switches, and more particularly to such switches having laser-activated semiconductor devices.

Optically switching techniques are becoming more attractive than the conventional electrical methods in the area of high-speed pulse technology. The main advantages are jitter-free switching, fast rise-time, high-power handling capability, large dynamic range, noise immunity, and high-voltage isolation between the control and switching circuits Mode-locked solid-state lasers producing intense ultrashort optical pulses with durations of a few picoseconds or less, and peak powers of many megawatts, have generally been used as the light source for optically activated switches. Such a light source, however, has disadvantages in that solid-state lasers are bulky, heavy, inefficient and costly. These disadvantages prohibit their use in many applications, especially in airborne equipment.

In recent years semiconductor laser diodes have been used as an optical source as an alternative to the complex and expensive solid-state lasers. While individual laser diodes have a peak power output capability of generally less than 10 W, a number of diodes can be combined to produce peak powers in excess of a few kilowatts. Typical power densities are in excess of 2 kW/cm$^2$, with overall efficiencies greater than 30 percent. The construction of a laser diode array having hundreds of emitting junctions closely arranged in a two-dimensional array of desired length and width is described in A. Rosen et al., "Optically Achieved p-i-n Diode Switch Utilizing a Two-Dimensional Laser Array at 808 nm as an Optical Source," IEEE Transactions on Electron Devices, Vol. 36, No. 2, Feb. 1989, pages 367-374.

Several approaches have been used for fabricating an optically activated switch. In one approach, a conventional high-resistivity bulk-material, such as Si, Cr:GaAs, or Fe:InP, is used to form the switch. Two metal electrodes are evaporated on the surface with a gap separation sufficient to prevent electrical breakdown at the operating voltage. An optical port, or window, is provided to expose the gap region to light. When laser light of sufficient energy and intensity is incident in the gap region, the conductivity of the material is increased, turning the switch on. Removing the incident radiation decreases the conductivity and turns the switch off.

The main shortcoming of present bulk material switches is the restriction of their use to pulsed bias circuits to avoid excessive heating and thermal runaway; these switches are not useful in dc-biased applications. Also, the formation of good ohmic contacts on high-resistivity material is relatively hard to achieve.

In another approach, vertical, or mesa-type, p-i-n diodes have been fabricated from n-type high-resistivity silicon wafers, with a thickness of 250 microns and a resistivity of 1500 to 5000 ohms/cm, n-type materials being used to reduce the chance of type conversion during the high-temperature processing. Boron and phosphorus are diffused into opposite surfaces of the wafer from doped oxide layers to form the p+ and n+ regions of the diode, these regions being separated by the intrinsic region. Ohmic conductors, or contacts, are formed on the opposite p+ and n+ regions and an optical port is opened through one of the conductors to expose the intrinsic region to light from a laser diode array. The dimensions of the optical port preferably match those of the laser diode array to minimize the loss of optical power. The fabrication of such a vertical p-i-n diode with an optical port is described in the previously mentioned article in Vol. 36, No. 2, of the IEEE Transactions on Electron Devices.

The p-i-n diode is used in a reverse bias mode, with the reverse current being modulated by electron-hole pairs created in the intrinsic region by the absorption of incident laser light of sufficient energy and intensity to increase the conductivity of the material. These carriers are swept out of the intrinsic region due to the large electric field present in the region. The device is turned off by removal of the incident radiation.

Two significant advantages result from the use of a p-i-n junction device instead of a bulk device in a switching application. First, the reverse saturation current of a silicon p-i-n diode is significantly lower than the leakage current of a bulk silicon device. Therefore, the p-i-n diode can be reverse biased for long periods of time without thermal runaway. Second, in a p-i-n device, the ohmic contacts are applied to the p+ and n+ regions which presents much less difficulty than forming good ohmic contact with high-resistivity material.

For a given semiconductor, the wavelength range in which appreciable photocurrent can be generated is limited. For light waves whose energy is less than the bandgap energy, the intrinsic optical absorption coefficient is too small to give appreciable absorption. For high-energy photons, this coefficient is very large and absorption takes place near the surface where the recombination time is short. The photocarriers thus recombine before they are swept out.

To achieve a fast response time in illuminating a vertical p-i-n diode through an optical port, three factors must be considered. These are the diffusion of the carriers, the drift time of the carriers in the depletion region, and the capacitance of the depletion region. Photons absorbed outside the depletion region generate electron-hole pairs that must diffuse to the junction, resulting in delay time. The effect can be minimized by forming the junction very close to the surface.

With sufficiently large reverse-bias voltages, the carriers generated will drift at their scatter-limited velocities. In silicon, the scatter-limited velocity is $10^7$ cm/sec; therefore, in order to achieve a device response time in the order of 0.5 nanoseconds, the intrinsic region width (i.e. the distance between the p+ and n+ contacts) for a vertical p-i-n diode must be less than 50 microns or transit time effects will limit the frequency response. However, the intrinsic region width must be greater than several inverse absorption coefficients to assure maximum collection of the light energy.

Rosen et al., "100 kW DC-Biased, All Semiconductor Switch Using Si P-I-N Diodes and AlGaAs 2-D Laser Arrays," IEEE Photonics Technology Letters, Vol. 1, No. 6, June 1989, pages 132-134, describes the operation of a switch using a two-dimensional laser diode array having a radiating area of 10 mm ×6.5 mm, and a p-i-n diode with an optical port of matching dimensions. When a single p-i-n diode, with a reverse bias of 1000 V, was activated by the laser array delivering 1 kW with an overall efficiency of 33 percent, the p-i-n diode conducted 56 A. Thus, the single p-i-n diode system could switch 56 kW. In order to increase the power, two similar p-i-n diodes were connected in parallel with a reverse dc bias of 1000 V when in the "off" state. When turned on by two laser diode arrays, one for the optical port of each p-i-n diode and each having a peak power of 1 kW, the two p-i-n diodes conducted 100A. Thus, this laser-activated switch, with two p-i-n diodes activated by two laser diodes arrays could switch 100 kW of power in a dc-biased mode. At the time of this paper, it was believed by the authors that those results were the best ever achieved.

SUMMARY OF THE INVENTION

It is the primary object of the present inventor to provide an optically controlled semiconductor switch having a significantly greater power handling capability than that of the prior devices.

Additional objects, advantage and novel features will be set forth in the description which follows, and in part will become apparent to those skilled in the art upon examination of the following, or may be learned by practice of the invention. The objects and advantages of the invention may be realized and attained by means of the instrumentalities and combinations pointed out in the appended claims.

To achieve the foregoing and other objects, and in accordance with the present invention as described and broadly claimed herein, a semiconductor switch device is provided, the device having high or low electrical conductance in the presence or absence, respectively, of illumination by light of sufficient energy and intensity. The semiconductor device has two opposed surfaces each of which has a conductor in electrical contact therewith, and an optical port through each of the conductors to expose both surfaces of the semiconductor for illumination thereof.

In a further aspect of the invention, a first power supply applies a voltage across the semiconductor device and a second power supply energizes and deenergizes a light emitting means positioned to illuminate both surfaces of the semiconductor device through both of the optical ports.

BRIEF DESCRIPTION OF THE DRAWINGS

The accompanying drawings, which are incorporated in and form part of the application, together with the description, serve to explain the principles of the invention.

FIG. 1 is a schematic view of a light-activated semiconductor switching circuit in accordance with the present invention, with the semiconductor switch device shown in cross section.

FIGS. 2 and 3 are sectional views of the semiconductor switch device of FIG. 1 as seen from lines 2—2 and 3—3, respectively, of FIG. 1.

FIG. 4 is a view similar to FIGS. 2 or 3, showing another shape of a semiconductor switch device and another form of optical port therefor.

FIG. 5 is a cross sectional view of another form of semiconductor switch device in accordance with the present invention.

DESCRIPTION OF THE PREFERRED EMBODIMENTS

Referring now to the drawings, wherein a preferred embodiment of the invention is illustrated, the light-activated switching circuit 10 includes a semiconductor switch device 11 of high or low electrical conductance in the presence or absence, respectively, of illumination by light of sufficient energy and intensity. As illustrated in FIGS. 1-3, the semiconductor device 11 is a p-i-n diode 12 having opposed surfaces 13 and 14 onto which electrical conductors 16 and 17 are plated. The p-i-n diode 12 has p+ and n+ regions 18 and 19 separated by an intrinsic region 21, with the p+ and n+ regions extending to the surfaces 13 and 14. The p-i-n diode may preferably be of silicon, with boron and phosphorous diffused into the opposite surfaces of the diode to form the p+ and n+ regions. If desired, gallium arsenide may be used as the intrinsic material of the p-i-n diode. The conductors 16 and 17 are preferably gold. For purposes of illustration, the p+ and n+ and i (intrinsic) regions are not shown to scale. In an actual p-i-n diode, the width of the i region may be in the order of 244 microns, while the widths of the p+ and n+ regions are each in the order of 3 microns.

In the manufacturer of the device 11, both surfaces 13 and 14 of the p-i-n diode are initially fully plated. Subsequently, photoresist is applied to both conductors to define optical ports and the conductors are chemically etched to form the optical ports 23 and 24 which expose the surfaces 13 and 14 of the p-i-n diode for illumination.

As shown in FIGS. 1-3, the p-i-n diode is circular in shape, and optical ports 23 and 24 are likewise circular. However, the p-i-n diode and/or the optical ports may have other configurations. For example, FIG. 4 illustrates a p-i-n diode 11a of rectangular shape, with a rectangular optical port 23a through conductor 16a to the surface 13a. If desired, the conductor 16a may have integral portions 26 in electrical contact with surface 13a and extending across the optical ports 23a to increase the electrical contact between the p+ region of the diode and the conductor 16a.

Referring back to FIG. 1, two solid state laser diode arrays 31 and 32 are positioned relative to the p-i-n diode so that the radiation (indicated by arrows) from the laser diode arrays, when energized, will pass through the optical ports 23 and 24 to illuminate the surfaces 13 and 14 of the p-i-n diode. The laser diode arrays may be manufactured as described in the previously-referred to article in IEEE Transactions on Electron Devices, Vol. 36, No. 2, February 1989.

A first power supply 33 is connected through load 34 to conductors 16 and 17 to provide a high dc-voltage reverse bias to the p-i-n diode so that the diode will be in its "off" state. A second power supply 35 is connected to the two laser diode arrays 31 and 32 for energizing those arrays when so desired.

A switching circuit has been made in accordance with the invention, with a silicon p-i-n diode 12.25 mm×7.25 mm×0.28 mm thick and having optical ports on both sides of the device, and with two 1 kW laser diode arrays for activation of the p-i-n diode. The p-i-n diode was held in "off" state by a reverse bias of 1.3 kV and conducted 192A when activated by the two laser diode arrays. The rise-time (from "off" to "on") and fall-time (from "on" to "off") were measured to be 289 and 300 nanoseconds, respectively.

Thus, the device operated to switch 250 kW, as compared to the operation of the single optical port devices described in the previously referred to article in IEEE Photonics Technology Letters, Vol. 1, No. 6, June 1989, wherein a single p-i-n diode with approximately the same size optical port and energized by one 1 kW laser diode array operated to switch 56 kW, and wherein two such p-i-n diodes, in parallel and activated by two 1 kW laser arrays, operated to switch 100 kW.

It was found that the two-ported p-i-n diode of the present invention was "on" (fully switched) when the laser power was only 400 watts, indicating that only a portion of the 1 kW power available from each laser diode array is needed to maximize the conduction through the p-i-n diode.

FIG. 5 illustrates another form of semiconductor switch device 11b which may be used in the switching system of FIG. 1. In this case, the semiconductor switch 11b is a bulk-type device 12b of high resistivity material such as silicon or gallium arsenide, again with conductors 16b and 17b in electrical contact with the opposite surfaces 13b and 14b of device 12b, and with optical ports 23b and 24b formed through the conductors to the surfaces 13b and 14b. When such a device, with presently known intrinsic material, is used in a switching system as FIG. 1, the power supply 33 should function to provide a high volt age across the device on a pulsed basis to prevent thermal runaway.

The foregoing description of the preferred embodiments has been presented for purposes of illustration and description. It is not intended to be exhaustive or to limit the invention to the precise forms described, and obviously many other modifications are possible in light of the above teaching. The embodiments were chosen in order to explain most clearly the principles of the invention an its practical applications thereby to enable others in the art to utilize most effectively the invention in various other embodiments and with various other modifications as may be suited to the particular use contemplated. It is intended that the scope of the invention be defined by the claims appended hereto.

We claim:

1. A light-activatable device comprising:
    a semiconductor device having high electrical conductance in the presence of illumination by light of sufficient energy and intensity and having low conductance in the absence of illumination by such light, said semiconductor device having two opposed surfaces,
    a first conductor in electrical contact with one of said opposed surfaces of said semiconductor device, said first conductor having an optical port therethrough exposing said one surface for illumination thereof,
    a second conductor in electrical contact with the other of said opposed surface of said semiconductors device, said second conductor having an optical port therethrough exposing said other surface for illumination thereof.

2. A light-activatable device as set forth in claim 1 wherein said semiconductor device is a p-i-n diode having p+ and n+ regions separated by an intrinsic region, said p+ region extending to one of said opposed surfaces of said semiconductors devices and said n+ region extending to the other of said opposed surfaces.

3. A light-activatable device as set forth in claim 1 wherein said semiconductor device is of high-resistivity bulk material extending to said surfaces thereof.

4. A light-activated semiconductor switch comprising:
    a semiconductor device having high electrical conductance in the presence of light of sufficient energy and intensity and having low electrical conductance in the absence of such light, said semiconductor device having two opposed surfaces,
    a first conductor in electrical contact with one of said opposed surfaces of said semiconductor device, said first conductor having an optical port therethrough exposing said one surface,
    a second conductor in electrical contact with the other of said opposed surface of said semiconductor device, said second conductor having an optical port therethrough exposing said other surface,
    light-emitting means positioned relative to said semiconductor device for illuminating said opposed surfaces of said semiconductor device through both of said optical ports with light of sufficient energy and intensity to increase the conductance of said semiconductor device.

5. A light-activated semiconductor switch as set forth in claim 4 wherein said light emitting means includes at least one laser device.

6. A light-activated semiconductor switch as set forth in claim 4 wherein said semiconductor device is a p-i-n diode having p+ and n+ regions separated by an intrinsic region, said p+ region extending to one of said opposed surfaces of said semiconductor device and said n+ region extending to the other of said opposed surfaces.

7. A light-activated semiconductor switch as set forth in claim 6 wherein said light emitting means includes at least one laser device.

8. A light-activated semiconductor switch as set forth in claim 6 wherein said light emitting means includes a first solid-state laser diode array positioned to illuminate one surface of said semiconductor device through said optical port of said first conductor and a second solid-state laser diode array positioned to illuminate the other surface of said semiconductor device through said optical port of said second conductor.

9. A light-activated semiconductor switch as set forth in claim 4 wherein said semiconductor device is of high-resistivity bulk material extending to said opposed surfaces thereof.

10. A light-activated semiconductor switch as set forth in claim 9 where wherein said light emitting means includes at least one laser device.

11. A light-activated semiconductor switch as set forth in 9 claim wherein said light emitting means includes a first solid-state laser diode array positioned to illuminate one surface of said semiconductor device through said optical port of said first conductor and a second solid-state laser diode array positioned to illuminate the other surface of said semiconductor device through said optical port of said second conductor.

12. A light-activated semiconductor switching system comprising:
    a semiconductor switch device having high electrical conductance in the presence of light of sufficient energy and intensity and having low electrical conductance in the absence of such light, said semiconductor device having two opposed surfaces,
    a first conductor in electrical contact with one of said opposed surfaces of said semiconductor device, said first conductor having an optical port therethrough exposing said one surface,
    a second conductor in electrical contact with the other of said opposed surfaces of said semiconductor device, said second conductor having an optical port therethrough exposing said other surface, light emitting means positioned relative to said semiconductor device for illuminating said opposed surfaces of said semiconductor device through both of said optical ports with light of sufficient energy and intensity to increase the conductance of said semiconductor device, a first power supply means connected to said first and second conductors for providing a bias voltage across said semiconductor device, a second power supply means for energizing or deenergizing said light emitting means.

13. A light-emitting semiconductor switching system as set forth in claim 12 wherein said light emitting means includes at least one laser device.

14. A light-activated semiconductor switching system as set forth in claim 12 wherein said semiconductor device is a p-i-n diode having p+ and n+ regions separated by an intrinsic region, said p+ region extending to one of said opposed surfaces of said semiconductor device and said n+ region extending to the other of said opposed surfaces, and wherein said first power supply means functions to provide a dc-voltage reverse bias across said p-i-n diode.

15. A light-emitting semiconductor switching system as set forth in claim 14 wherein said light emitting means includes at least one laser device.

16. A light-activated semiconductor switch as set forth in claim 14 wherein said light emitting means includes a first solid-state laser diode array positioned to illuminate one surface of said semiconductor device through said optical port of said first conductor and a second solid-state laser diode array positioned to illuminate the other surface of said semiconductor device through said optical port of said second conductor.

17. A light-activated semiconductor switching system as set forth in claim 12 wherein said semiconductor device is of high-resistivity bulk material extending to said opposed surfaces thereof.

18. A light-activated semiconductor switching system as set forth in claim 17 wherein said light emitting means includes at least one laser device.

19. A light-activated semiconductor switching system as set forth in claim 17 wherein said light emitting means includes a first solid-state laser diode array positioned to illuminate one surface of said semiconductor device through said optical port of said first conductor and a second solid-state laser diode array positioned to illuminate the other surface of said semiconductor device through said optical port of said second conductor.

* * * * *